United States Patent [19]

Rozman

[11] Patent Number: 4,922,123

[45] Date of Patent: May 1, 1990

[54] SUPPLY CIRCUIT FOR A HALL SENSOR MULTIPLICATION CIRCUIT

[75] Inventor: Miro Rozman, Lesce, Yugoslavia

[73] Assignee: Iskra-Sozd Elektrokovinske Industrije N.Sol.O., Ljubljana, Yugoslavia

[21] Appl. No.: 324,414

[22] Filed: Mar. 16, 1989

[30] Foreign Application Priority Data

Mar. 18, 1988 [YU] Yugoslavia .............................. 556/88

[51] Int. Cl.$^5$ ...................... G01R 21/08; G01R 21/00; G01R 21/06
[52] U.S. Cl. ............................... 307/309; 324/117 H; 324/117 R; 324/127; 324/142; 338/32 H
[58] Field of Search .................... 307/309; 324/117 H, 324/117 R, 127, 142; 338/32 R, 32 H; 323/211, 322, 349

[56] References Cited

U.S. PATENT DOCUMENTS

| | | | |
|---|---|---|---|
| 3,746,851 | 7/1973 | Gilbert | 365/842 |
| 3,775,683 | 11/1973 | Barta et al. | 324/142 |
| 3,975,682 | 8/1976 | Mayfield | 324/142 |
| 4,066,960 | 1/1978 | Milkovic | 324/142 |
| 4,742,296 | 5/1988 | Petr et al. | 324/142 |
| 4,808,918 | 2/1989 | Rozman | 324/142 |

FOREIGN PATENT DOCUMENTS 267693A  5/1988  European Pat. Off. ............ 324/142

Primary Examiner—Stanley D. Miller
Assistant Examiner—Terry Cunningham
Attorney, Agent, or Firm—Fleit, Jacobson, Cohn, Price, Holman & Stern

[57] ABSTRACT

Supply circuit SC for a Hall sensor multiplication circuit HSC makes it possible to produce both circuits in monolithic technology on a common substrate and yet accomplish the polarity reversal of the output voltage $U_H$ of the multiplication circuit HSC with such accuracy that at said reversal the absolute value of the voltage $U_H$ is preserved with an accuracy of 0.01%.

2 Claims, 3 Drawing Sheets

SUPPLY CIRCUIT FOR A HALL SENSOR MULTIPLICATION CIRCUIT

BACKGROUND OF THE INVENTION

1. Technical Field

This invention relates to a supply circuit supplying electric current to a Hall sensor multiplication circuit in such a way that the absolute value of the output voltage of the multiplication circuit is changed for about 0.01% at most when the polarity of this output voltage is reversed.

2. Description of the Prior Art

In known watthour meters or wattmeters which are based on the Hall effect a multiplication circuit reversing the polarity of the output Hall voltage is used to compensate internal disturbances of the meter. Such meters are described e.g. in DE 37 11 978 A1 and DE 37 02 344 A1.

A known multiplication circuit is composed of a Hall sensor 6' whose first voltage terminal is connected to the inverting input of an operational amplifier A', the second terminal, however, is connected to the output of the multiplication circuit, and of a switching bridge which is made of controlled switches 2',3',4',5' and which supplies electric current across a resistor 7' being connected to one terminal of a load to current terminals of the Hall sensor 6' (FIG. 1). A signal P from a voltage to frequency converter controls the polarity of the Hall voltage $U_H$ at the multiplication circuit output by exchanging the current terminals of the Hall sensor 6'. The described multiplication circuit performd in a monolithic technology provides good results when the Hall sensor is performed separately from the rest of the multiplication circuit. When, however, the Hall sensor is integrated with the rest of the multiplication circuit on a common substrate the accuracy of the polarity reversal of the Hall voltage $U_H$ is affected by the nonideally symmetric shape of the Hall sensor as well as by the nonlinearity originating from a barrier layer separating the Hall sensor from the substrate.

SUMMARY OF THE INVENTION

In accordance with the foregoing background discussion the object of this invention is to provide a supply circuit which will supply a Hall sensor multiplication circuit with electric current whose intensity at a current sense reversal caused by a control signal will be changed for only about 0.01% of its absolute value, the supply circuit and the multiplication circuit, however, must be able to be produced in a monolithic technology on a common substrate.

With the foregoing objects in view, the supply circuit in accordance with the invention is characterized by features of the characterizing portion of the claims 1 and 2.

A specific embodiment of the invention will be presented in the following detailed description in conjunction with the accompanying drawings.

DETAILED DESCRIPTION OF THE PREFERRED EMBODIMENT

Figure 1:
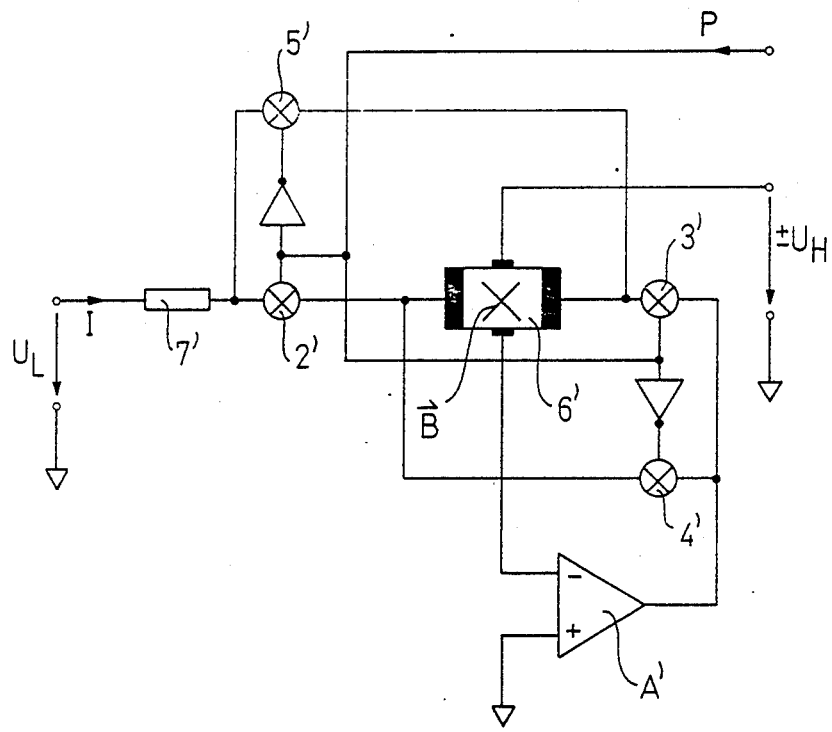
FIG. 1 is a multiplication circuit known in the prior art.
Figure 2:
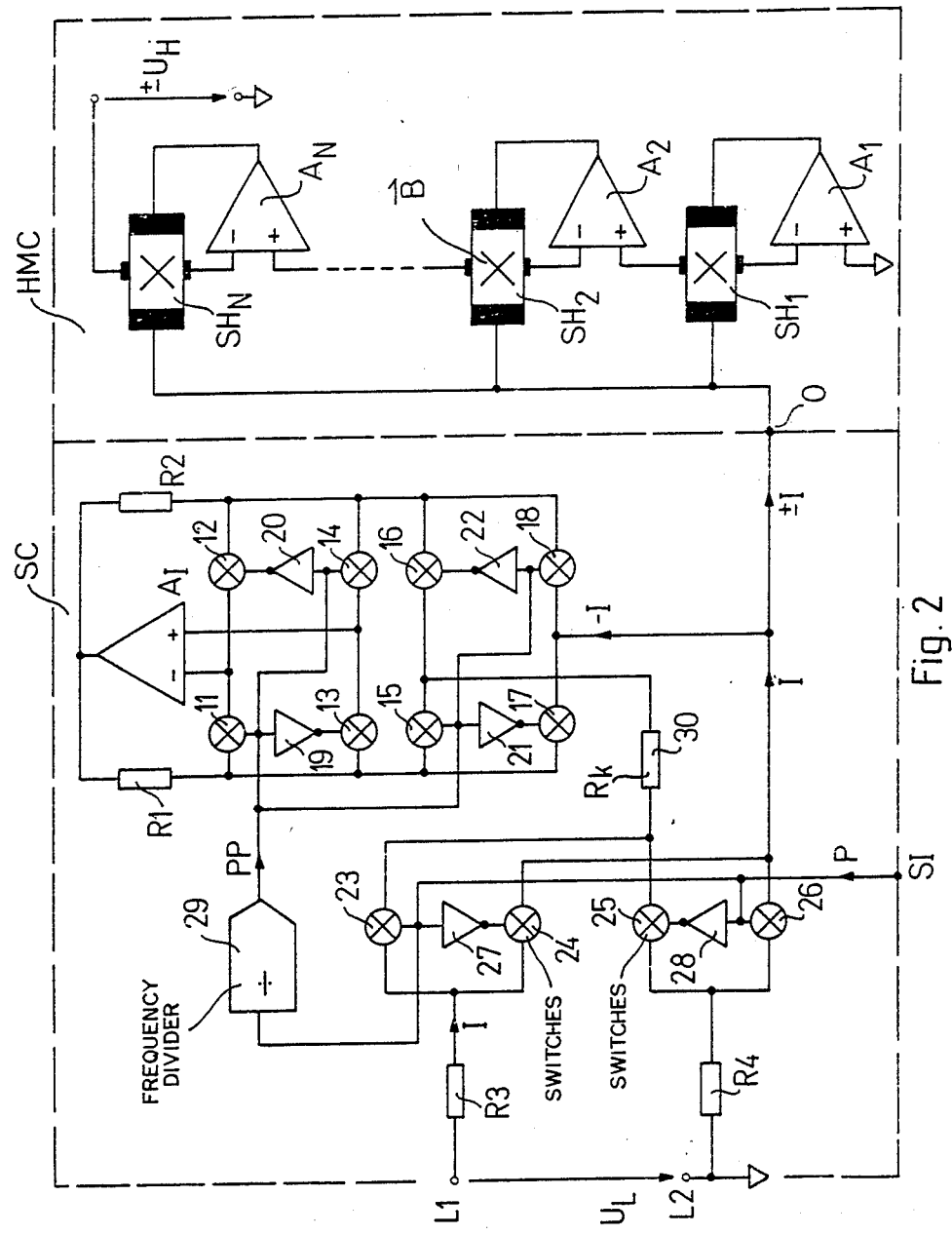
FIG. 2 is a graphical illustration of the supply circuit of the invention, and of a Hall sensor multiplication circuit.

The supply circuit SC in accordance with the invention for supplying electric current to a Hall sensor multiplication circuit HMC is shown in FIG. 2. The output O of the supply circuit SC is connected to the current input of the multiplication circuit HMC. At the output of the multiplication circuit HMC, which is performed by Hall sensors $SH_j$, cascade connected through operational amplifiers $A_j$, the voltage $U_H$ appears.

Load terminals L1,L2 of the supply circuit SC, the load terminal L2 being grounded, are connected to terminals of an external load, whose electric energy or power consumption is measured. Magnetic induction B at the Hall sensors $SH_j$ is proportional to the electric current through the load causing a voltage drop $U_L$ thereon. The terminal L1 is, through a resistor R3 connected, on the one hand through a controlled switch 23 to the first terminal of an adjustable resistor Rk and on the other hand through a controlled switch 24 to the output terminal O of the supply circuit SC. The output terminal O is connected through a controlled switch 26 to the first terminal of a resistor R4 and further through a controlled switch 25 to the first terminal of the resistor Rk. The second terminal of the resistor R4 is connected to the load terminal L2. The second terminal of the resistor Rk is connected to a common terminal of controlled switches 15,16, the second terminal of these switches being connected to a common terminal of controlled switches 11,13 and 12,14, respectively, and to the first terminal of a resistor R1 and R2, respectively. The second terminal of the resistors R1,R2 is connected to the output of an operational amplifier $A_I$, which together with the resistors R1,R2 forms a negative impedance converter. The inverting input of the amplifier $A_I$ is connected to the second terminal of the switches 11,12, the noninverting input, however, is connected to the second terminal of the switches 13,14. The first terminal of the resistors R1,R2 is connected through controlled switches 17 and 18, respectively, to the output terminal O of the supply circuit SC.

The signal input terminal SI of the circuit SC is connected to the control terminal of the switches 23,26 and to the input of a frequency divider 29, and through inverters 27,28 to the control terminal of the switches 24 and 25, respectively. The output of the divider 29 is connected to the control terminal of the switches 11,14,15,18, and through inverters 19,20,21,22 to the control terminal of the switches 13,12,17,16, respectively.

The resistances of the resistors R1,R2 are equal, the resistance of the resistor Rk equals the doubled resistance of the load at the output O of the supply circuit SC.

Figure 3A:
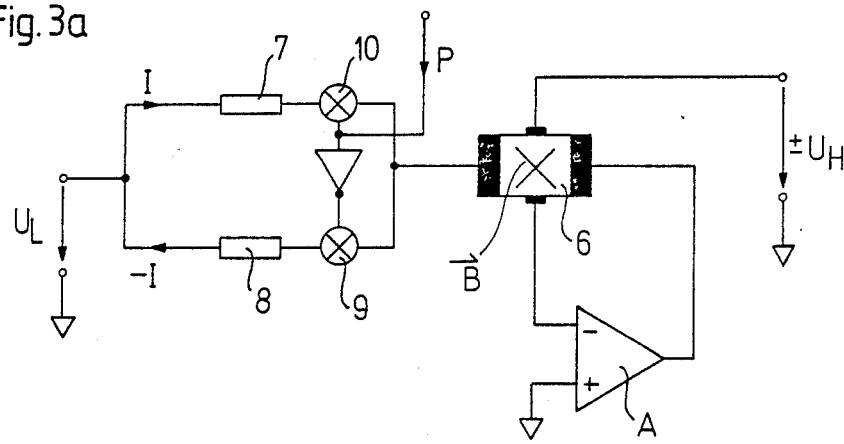
FIGS. 3a and 3b are schematic illustrations of the supply circuit of the invention and of a negative impedance converter, respectively.

For the moment the operation of the supply circuit SC in accordance with the invention will be represented schematically with FIGS. 3a,b. Alternately through the switches 9,10 the current $-I$ and $+I$, respectively, is supplied to the multiplication circuit which is composed of a Hall sensor 6 and of an operational amplifier A (FIG. 3a). Resistors 7,8 symbolically represent oppositely equal resistances with an absolute value equal to the equivalent resistance of both the supply circuit and the multiplication circuit.

Figure 3B:
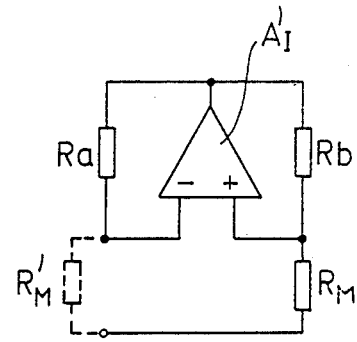

A negative impedance converter (FIG. 3b) composed of an operational amplifier $A_I'$ and of resistors Ra,Rb transforms the resistance $R_M$ at the output into the resistance $R_M' = -R_M \cdot Ra/Rb$ at the input if the resistors Ra,Rb are connected as represented in FIG. 3b, and into the resistance $R_M' = -R_M \cdot Rb/Ra$ if the resistors in FIG. 3b are mutually interchanged. If this interchanging is performed by a control signal P periodically with realization times of both configurations being equal then the input resistance is averaged to $R_{M,av}' = -(Ra/Rb + Rb/Ra) \cdot R_M/2$. Supposing that in monolithic technology two resistors with equal resistances differing for 1% can be made, it follows from the last expression that the relation $R_M' = -R_M$ is realizable with an accuracy of 0.01%.

At the output O of the circuit SC there flows the supply current $I = U_L/(R3 + R_M)$ when the signal P at the input SI is logic 0; here by $R_M$ the resistance of the multiplication circuit HMC connected to the output O is meant. When the signal P is logic 1 the supply current is $I = -U_L/(R3 + Rk - R_M)$ and its absolute value equals the absolute value of the former supply current if it is set $Rk = 2R_M$. With a signal PP appearing at the output of the frequency divider 29 the mutual interchanging of the resistors R1,R2 in the negative impedance converter is controlled.

A parasitic current originating from the offset voltage of the operational amplifier $A_I$ is conducted to a mass through the resistor R4. The parasitic current is compensated most completely when the resistances of the resistors R3,R4 are equal.

The advantage of the circuit according to the invention exists in that the absolute value of the output voltage of the Hall sensor multiplication circuit integrated in a monolithic technology on a common substrate with the supply circuit is preserved with an accuracy of 0.01% at the polarity reversal of this voltage.

What is claimed is:

1. Supply circuit for a Hall sensor multiplication circuit, characterized in
   that a load terminal (L1) is through a resistor (R3) connected, through a switch (23) to the first terminal of an adjustable resistor (Rk), and through a switch (24) to the output terminal (O) and through a switch (26) to the first terminal of a resistor (R4), whose second terminal is connected to a grounded load terminal (L2), and through a switch (25) to the first terminal of the resistor (Rk),
   that the second terminal of the resistor (Rk) is connected to a common terminal of switches (15,16), whose second terminal is connected to the common terminal of switches (11,13;12,14, resp.) and to the first terminal of resistors (R1,R2, resp.) the second terminal of these resistors being connected to the output of an operational amplifier ($A_I$), whose inverting input is connected to the second terminal of the switches (11,12) and whose noninverting input is connected to the second terminal of the switches (13,14),
   that the output terminal (O) is connected through switches (17,18) to the first terminal of the resistors (R1,R2, resp.),
   that the signal input terminal (SI) is connected to the control terminal of the switches (23,26), and through inverters (27,28) to the control terminal of the switches (24,25, resp.) and to the input of a frequency divider (29),
   and that the output of the frequency divider (29) is connected to the control terminal of the switches (11,14,15,18) and through inverters (19,20,21,22) to the control terminal of the switches (13,12,17,16, resp.).

2. Circuit as recited in claim 1, characterized in that the resistances of the resistors (R1,R2) are equal and the resistance of the adjustable resistor (Rk) equals twice the resistance of the load at the circuit output (O).

* * * * *